(12) United States Patent
Koresawa et al.

(10) Patent No.: US 10,353,522 B2
(45) Date of Patent: Jul. 16, 2019

(54) OPERATION SWITCH USING ELECTROSTATIC CAPACITANCE SENSOR

(71) Applicant: Panasonic Intellectual Property Management Co., Ltd., Osaka (JP)

(72) Inventors: Kouhei Koresawa, Kyoto (JP); Gosuke Sakamoto, Kyoto (JP); Takashi Satou, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 161 days.

(21) Appl. No.: 15/439,984

(22) Filed: Feb. 23, 2017

(65) Prior Publication Data

US 2017/0277301 A1    Sep. 28, 2017

(30) Foreign Application Priority Data

Mar. 25, 2016  (JP) ................................ 2016-061278

(51) Int. Cl.
  *G06F 3/044*    (2006.01)
(52) U.S. Cl.
  CPC .... *G06F 3/044* (2013.01); *G06F 2203/04108* (2013.01)
(58) Field of Classification Search
  CPC G06F 3/044; G06K 9/00899; G06K 9/00906; G01R 27/02; H03K 2217/960715; H03K 17/962
  See application file for complete search history.

(56) References Cited

U.S. PATENT DOCUMENTS

| 4,211,959 A * | 7/1980 | Deavenport | F21V 23/04 200/600 |
| 5,990,804 A * | 11/1999 | Koyama | G06K 9/0012 331/65 |
| 6,181,808 B1 * | 1/2001 | Fukuzumi | G06K 9/00006 382/126 |
| 8,982,097 B1 * | 3/2015 | Kuzo | G06F 3/0418 345/174 |
| 2010/0187216 A1 | 7/2010 | Komada et al. | |
| 2012/0176179 A1 * | 7/2012 | Harders | H03K 17/962 327/517 |
| 2012/0274604 A1 * | 11/2012 | Norton | H03K 17/962 345/174 |

(Continued)

FOREIGN PATENT DOCUMENTS

| JP | 58-219824 | 12/1983 |
| JP | 2008-042724 | 2/2008 |

(Continued)

*Primary Examiner* — Daniel R Miller
(74) *Attorney, Agent, or Firm* — McDermott Will & Emery LLP

(57) ABSTRACT

An operation switch includes: an electrostatic capacitance sensor that generates a sensing signal in response to approach or contact of an object; and a controller that determines whether or not the object is a human body in accordance with the sensing signal. The controller determines that the object is not a human body, when (A) a magnitude of the sensing signal is larger than a first threshold at a first time point, (B) a rate of change in the magnitude of the sensing signal in a first period is larger than a first rate, and (C) the magnitude of the sensing signal does not fall below a second threshold in a second period subsequent to the first period.

18 Claims, 14 Drawing Sheets

(56) References Cited

U.S. PATENT DOCUMENTS

2013/0314106 A1* 11/2013 Gecnuk ................ G06F 3/0416
                                                        324/672
2014/0323068 A1* 10/2014 Chang ................ H04B 1/3838
                                                       455/127.2

FOREIGN PATENT DOCUMENTS

| JP | 2009-229248 | 10/2009 |
| JP | 2009-232152 | 10/2009 |
| WO | 2009/001544 | 12/2008 |

* cited by examiner

OPERATION SWITCH USING ELECTROSTATIC CAPACITANCE SENSOR

BACKGROUND

1. Technical Field

The present disclosure relates to an operation switch.

2. Description of the Related Art

Heretofore, operation switches have been used for users to perform, for example, operations for turning on or off equipment. As operation switches, switches using electrostatic capacitive sensors have been known. Each electrostatic capacitive sensor detects changes in an electrostatic capacitance which occur when a user's hand is in close proximity to or in contact with the sensor, thereby making it possible to sense close proximity or contact of his or her hand.

Japanese Unexamined Patent Application Publication No. 2009-229248 discloses a touch switch using an electrostatic capacitive sensor. When the rate of change in an electrostatic capacitance detected by the electrostatic capacitive sensor is small, the touch switch determines that an object that is in contact with the sensor is a finger, and when the rate of change in the electrostatic capacitance detected by the sensor is large, the touch switch determines that the object that is in contact with the sensor is a liquid droplet.

SUMMARY

In one general aspect, the techniques disclosed here feature an operation switch including: an electrostatic capacitance sensor that generates a sensing signal in response to approach or contact of an object; and a controller that determines whether or not the object is a human body in accordance with the sensing signal. The controller determines that the object is not a human body, when the following conditions (A), (B) and (C) are satisfied: (A) a magnitude of the sensing signal is larger than a first threshold at a first time point; (B) a rate of change in the magnitude of the sensing signal in a first period is larger than a first rate; and (C) the magnitude of the sensing signal does not fall below a second threshold in a second period subsequent to the first period.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
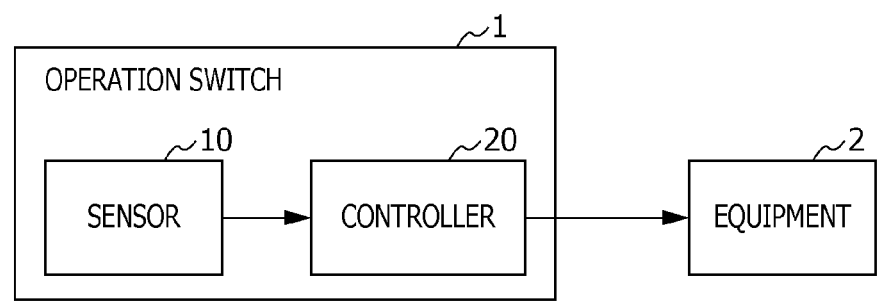
FIG. 1 is a block diagram illustrating an operation switch according to a first embodiment.

Embodiments of the present disclosure will be described below. The embodiments described below each represent a specific example of the present disclosure. Accordingly, numerical values, shapes, materials, constituent elements, the arrangements and connection of constitute elements, processes (steps), the order of processes, and so on described in the embodiments below are examples and are not intended to limit the present disclosure. Hence, of the constituent elements in the embodiments below, the constituent elements not set forth in the independent claim that represents the broadest concept of the present disclosure will be described as optional constituent elements.

Each accompanying figure is a schematic diagram and is not necessarily strictly depicted. Thus, for example, scales and so on do not necessarily match in each figure. In each figure, substantially the same elements are denoted by the same reference numerals, and a redundant description is omitted or is briefly given herein.

First Embodiment

The configuration of an operation switch 1 according to a first embodiment will be described with reference to FIG. 1. FIG. 1 is a block diagram illustrating the configuration of the operation switch 1 according to the first embodiment.

As illustrated in FIG. 1, the operation switch 1 includes a sensor 10 and a controller 20 that generates an operation signal on the basis of a sensing signal output from the sensor 10. In accordance with the operation signal generated by the controller 20, the operation switch 1 controls equipment 2. The operation switch 1 performs, for example, on/off control of the equipment 2.

The sensor 10 is an electrostatic capacitive sensor that senses close proximity or contact of an object to be sensed, such as a human body, by detecting an electrostatic capacitance. For example, by detecting a change in an electrostatic capacitance that occurs between an object to be sensed and a sensor electrode, the sensor 10 senses close proximity or contact of the object. Based on a sensing signal generated according to the electrostatic capacitance detected by the sensor 10, the controller 20 generates an operation signal. It is noted that the terms "close proximity" and "approach" in the present disclosure each mean a state of being within a predetermined distance from a sensor electrode.

Figure 2A:
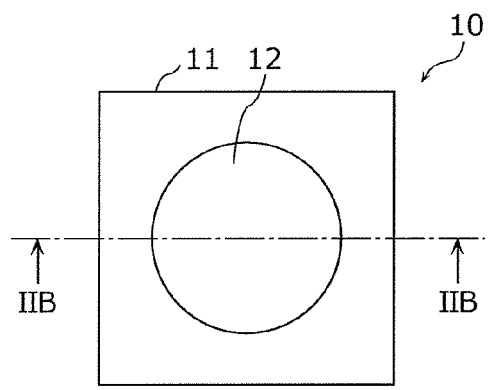
FIG. 2A is a plan view of a sensor used for the operation switch according to the first embodiment.
Figure 2B:
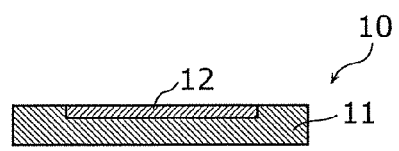
FIG. 2B is a sectional view of a sensor used in the operation switch according to the first embodiment, taken along line IIB-IIB in FIG. 2A.

As illustrated in FIGS. 2A and 2B, the electrostatic capacitive sensor 10 has a substrate 11 and a sensor electrode 12 formed in the substrate 11. FIG. 2A is a plan view of the sensor 10 used in the operation switch 1 according to the first embodiment, and FIG. 2B is a sectional view of the sensor 10 along line IIB-IIB in FIG. 2A.

The substrate 11 is, for example, a resin substrate made of resin material or a metal-based substrate obtained by applying insulation coating to metal. The plan-view shape of the substrate 11 is, for example, a rectangular shape, but is not limited thereto.

The sensor electrode 12 is made of, for example, metallic material, such as copper or silver, and is formed in one surface of the substrate 11 in a predetermined pattern. More specifically, the sensor electrode 12 is a solid electrode having a circular shape in plan view and is formed at the center of the substrate 11. The plan-view shape of the sensor electrode 12 is not limited to a circular shape and may be a rectangular shape or the like. Although not illustrated, the sensor electrode 12 is electrically connected to an electrical circuit in the controller 20 in order to detect a change in an electrostatic capacitance which is caused by close proximity or contact of an object to be sensed.

Figure 3:
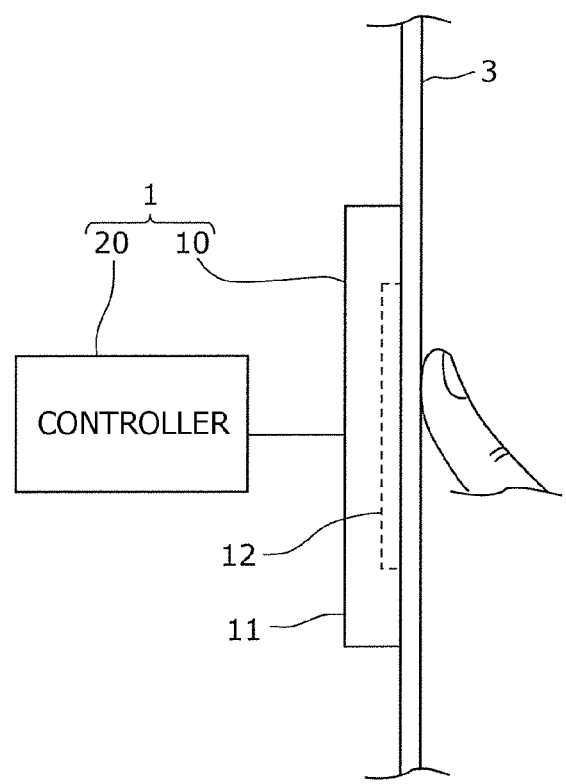
FIG. 3 is a schematic diagram schematically illustrating a use example of the operation switch according to the first embodiment.

As illustrated in FIG. 3, the operation switch 1 is installed, for example, to a mirror 3 at a sink. FIG. 3 is a schematic diagram illustrating a use example of the operation switch 1 according to the first embodiment.

The sensor 10 is installed, for example, to the back surface of the mirror 3 or a frame of the mirror 3. When the sensor electrode 12 detects an electrostatic capacitance, the sensor 10 senses that a human finger, which is an object to be sensed, is in close proximity to or in contact with the sensor 10. The controller 20 receives a sensing signal generated by the sensor 10, generates an operation signal for operating the equipment 2 (see FIG. 1) on the basis of the sensing signal, and outputs the operation signal to the equipment 2. This allows a user to perform an operation for, for example, turning on or off the equipment 2.

Although not illustrated in FIG. 3, the equipment 2 to be operated by the operation switch 1 is, for example, a lighting device (not illustrated) installed at a sink. In this case, for example, when the user brings his or her finger close to the sensor 10 (e.g., the sensor electrode 12) in order to operate the lighting device, as illustrated in FIG. 3, the sensor 10 generates a sensing signal indicating that the user's finger is sensed. The controller 20 receives the sensing signal generated by the sensor 10, generates an operation signal for operating turn-on/off of the lighting device on the basis of the sensing signal, and outputs the operation signal to the lighting device. This allows the user to perform an operation, such as on/off control, on the lighting device.

Figure 4A:
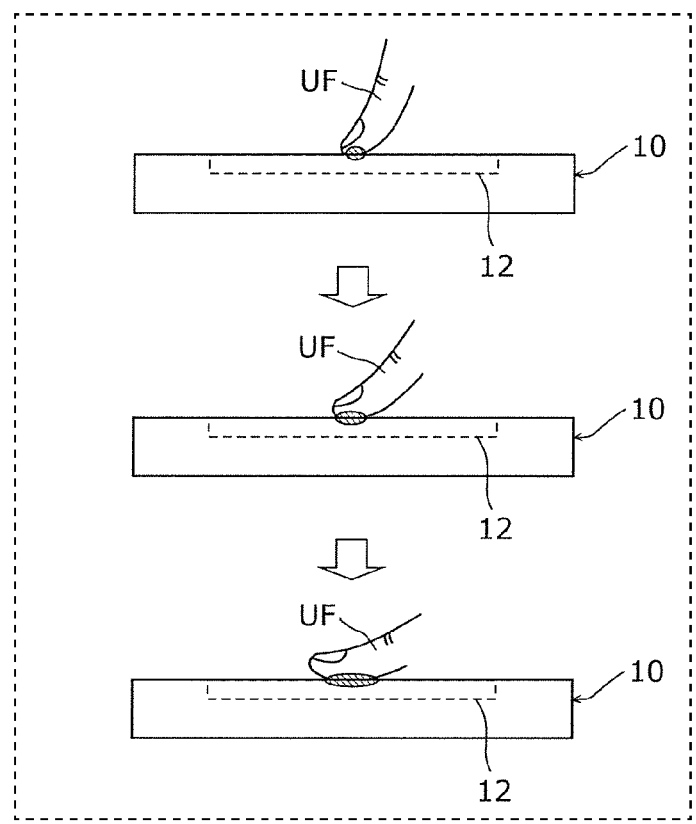
FIG. 4A is a diagram for describing a control method for a known operation switch (a diagram illustrating movement of a finger on a sensor)
Figure 4B:
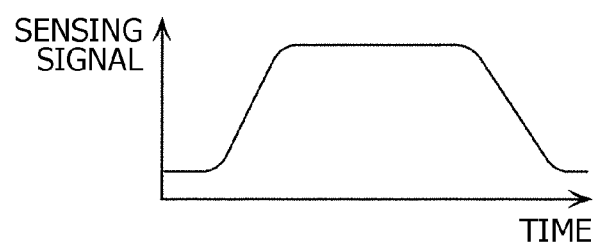
FIG. 4B is a graph for describing the control method for the known operation switch (a graph illustrating a sensing signal in the case of FIG. 4A)
Figure 5A:
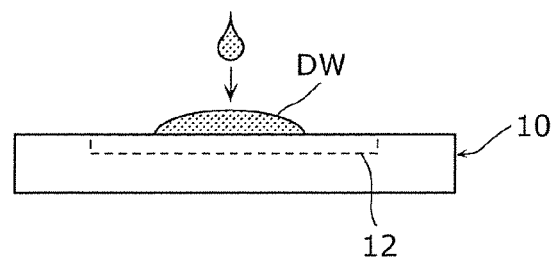
FIG. 5A is a diagram for describing the control method for the known operation switch (a diagram illustrating a state in which a liquid droplet adheres to the sensor)
Figure 5B:
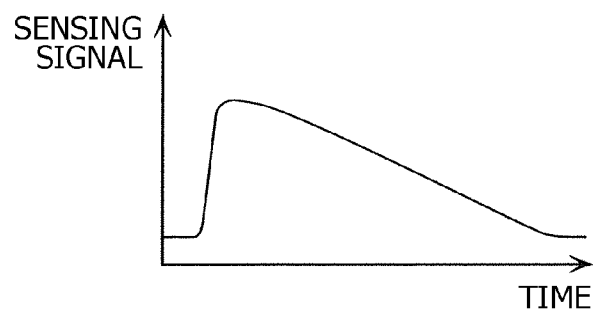
FIG. 5B is a diagram for describing the control method for the operation switch (a diagram illustrating the sensing signal in the case of FIG. 5A)
Figure 6:
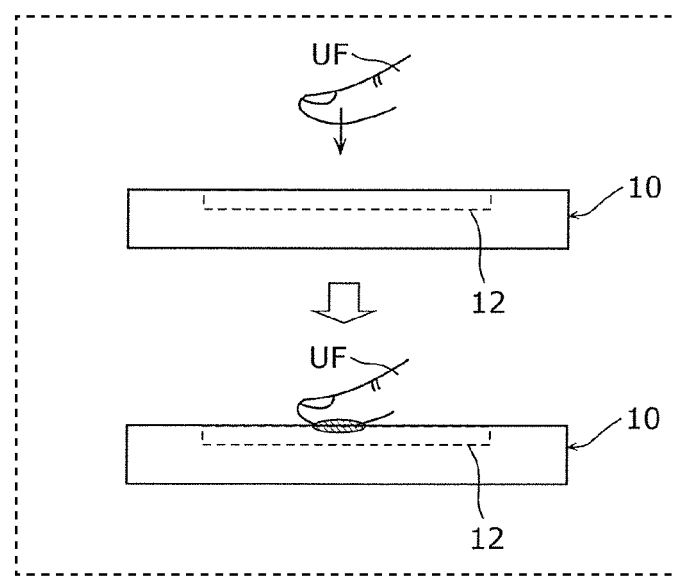
FIG. 6 is a diagram for describing a problem with the control method for the known operation switch block diagram (a diagram illustrating a case in which the sensor is touched with the pad of the finger)
Figure 7:
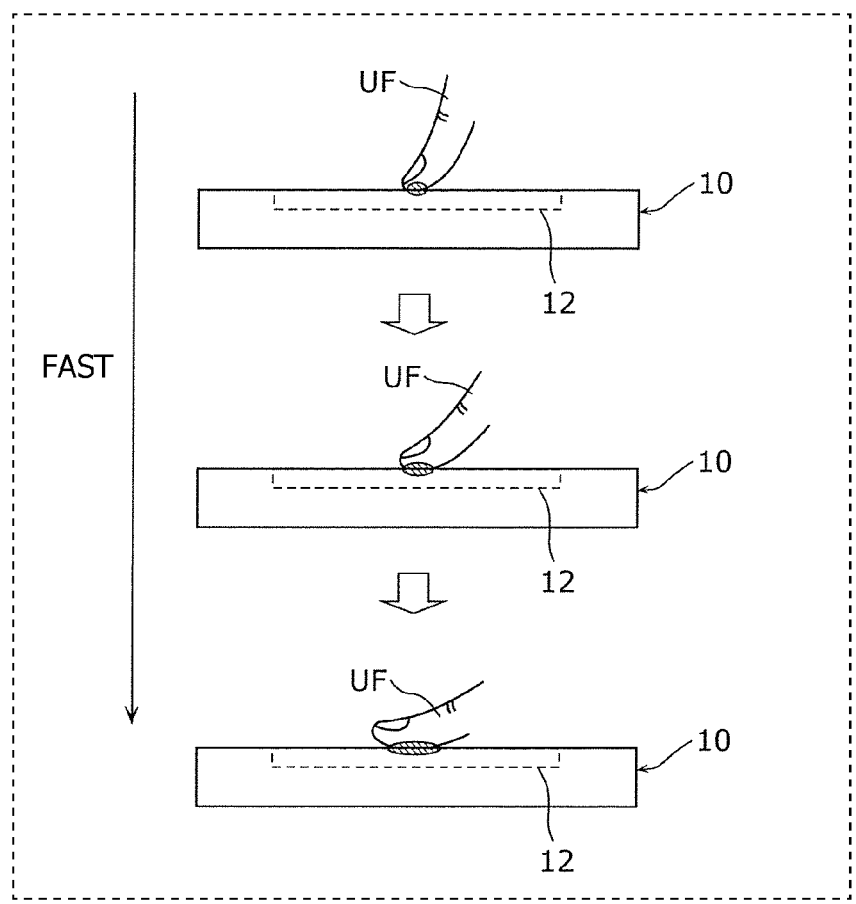
FIG. 7 is a diagram for describing a problem with the control method for the known operation switch (a diagram illustrating a case in which the operation speed of the finger is high)
Figure 8:
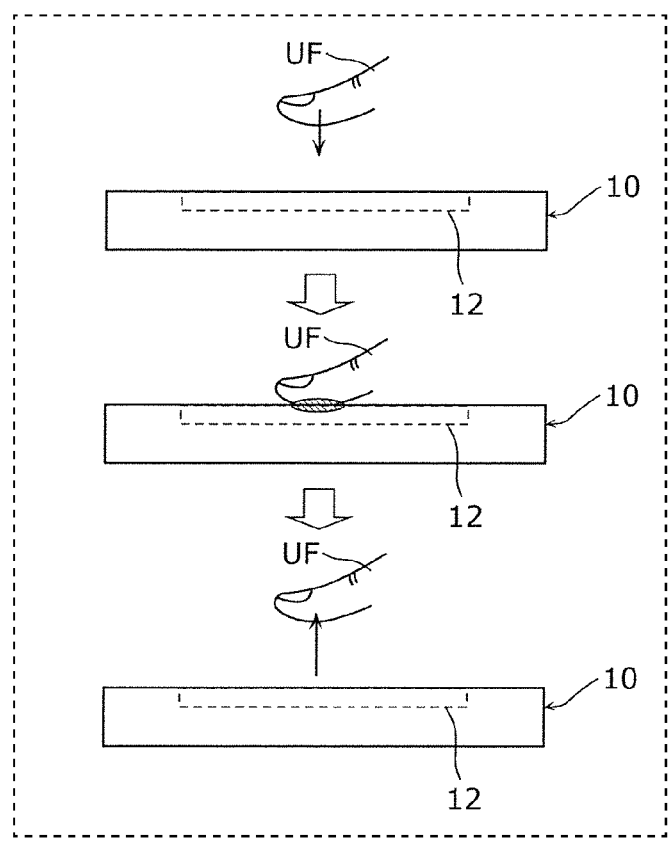
FIG. 8 is a schematic diagram schematically illustrating one example of movement of the finger during operation of the operation switch according to the first embodiment.
Figure 9:
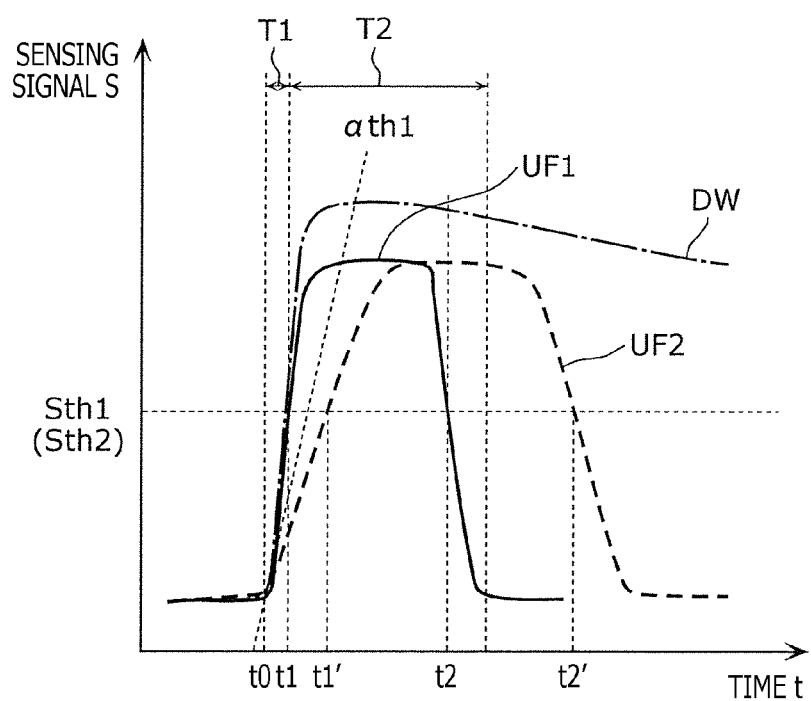
FIG. 9 is a graph for describing a control method for the operation switch according to the first embodiment.

Next, a method for control performed by the controller 20 in the operation switch 1 in the present embodiment, in conjunction with a background from which the present disclosure was derived, will be described with reference to FIGS. 4A to 9. FIGS. 4A to 5B are diagrams for describing a control method for a known operation switch 1X that can prevent malfunction due to adherence of a liquid droplet. FIG. 4A illustrates movement of a finger on a sensor. FIG. 4B illustrates a sensing signal in the case of FIG. 4A. FIG. 5A illustrates a state in which a liquid droplet adheres to the sensor. FIG. 5B illustrates a sensing signal in the case of FIG. 5A. FIGS. 6 and 7 are diagrams for describing a problem with the control method for the operation switch 1X, FIG. 6 illustrating a case in which the sensor is touched with the pad of the finger, and FIG. 7 illustrating a case in which the operation speed of the finger is high. FIG. 8 is a schematic diagram schematically illustrating one example of movement of the finger during operation of the operation switch 1 according to the first embodiment. FIG. 9 is a graph for describing a control method for the operation switch 1 according to the first embodiment.

When a user brings his or her finger UF into contact with the sensor 10 in order to operate the operation switch 1X, the area of contact between the finger UF and the sensor 10 increases gradually in the process of an operation of pressing the finger UF against the sensor 10, as illustrated in FIG. 4A. In this case, as illustrated in FIG. 4B, a sensing signal generated according to an electrostatic capacitance detected by the sensor 10 also increases gradually, as the area of contact of the finger UF increases.

On the other hand, when a liquid droplet DW adheres to the sensor 10, the liquid droplet DW immediately moistens the sensor 10 and spreads thereon, as illustrated in FIG. 5A. Thus, when the liquid droplet DW adheres to the sensor 10, the electrostatic capacitance detected by the sensor 10 increases immediately. Accordingly, as illustrated in FIG. 5B, the gradient of the sensing signal (i.e., the rate of increase in the sensing signal) from the sensor 10 increases. The reason why the sensing signal in FIG. 5B decreases gradually after increasing temporarily is that the liquid droplet DW gradually disappears from the sensor 10 through flow and so on of the liquid droplet DW.

In the known control method for the operation switch 1X, when the gradient of the sensing signal from the sensor 10 is small, it is determined that an object that is in close proximity to or in contact with the sensor 10 is the finger UF, and when the rate of increase in the sensing signal from the sensor 10 is large, it is determined that an object that is in close proximity to or in contact with the sensor 10 is a liquid droplet. This prevents malfunctioning of the operation switch 1X which is caused by adherence of a liquid droplet.

However, in such a known control method for the operation switch 1X, when the user touches the sensor 10 with the pad of the finger UF, the area of contact between the finger UF and the sensor 10 increases from the beginning, as illustrated in FIG. 6. In this case, since the electrostatic capacitance detected by the sensor 10 also increases immediately, the gradient of the sensing signal generated by the sensor 10 increases, as in FIG. 5B.

In addition, as illustrated in FIG. 7, when the speed of the operation of pressing the finger UF against the sensor 10 is high, the gradient of the sensing signal from the sensor 10 also increases, as in FIG. 5B.

As described above, when the user touches the sensor 10 with the pad of the finger UF, and/or when the speed of the operation of the finger UF onto the sensor 10 is high, the gradient of the sensing signal detected by the sensor 10 is large, similarly to the gradient in the case in which a liquid droplet adheres to the sensor 10. Thus, when only the gradient of the sensing signal is used, it is impossible to distinguish between a case in which the finger UF is in contact with the sensor 10 and a case in which a liquid droplet adheres to the sensor 10. Accordingly, even if the user attempts to operate the operation switch 1X, the operation switch 1X determines that a liquid droplet is in contact with the sensor 10. As a result, the operation of the user is not precisely detected.

However, even when the user touches the sensor 10 with the pad of the finger UF, as illustrated in FIG. 8, or when the speed of the operation of the finger UF onto the sensor 10 is high, the user will remove the finger UF from the sensor 10 within about 1 second or within about 0.5 second.

The operation switch 1 in the present embodiment determines whether or not the finger UF is in close proximity to or in contact with the sensor 10 by using a sensing determination algorithm as described below.

Specifically, in a case in which a sensing signal S generated according to an electrostatic capacitance detected by the sensor 10 exceeds a first threshold Sth1 at a first time point t1, as illustrated in FIG. 9, when the rate of change in the sensing signal S (e.g., the graph gradient of the sensing signal S) in a predetermined first period T1 until the first time point t1 is larger than a first gradient threshold $\alpha$th1, and the sensing signal S does not fall below a second threshold Sth2 in a predetermined second period T2 from the first time point t1, the controller 20 in the operation switch 1 determines that the finger UF is not in close proximity or not in contact (i.e., determines that the object detected by the sensor 10 is not a human body). In the present embodiment, the first threshold Sth1 and the second threshold Sth2 are the same. The first gradient threshold $\alpha$th1 is one example of a "first rate" in the present disclosure.

For example, when a liquid droplet adheres to the sensor 10, the sensing signal S generated by the sensor 10 exhibits a curve DW as indicated by a dashed-dotted line in FIG. 9. In this case, when the liquid droplet adheres to the sensor 10 at a time point t0, the liquid droplet moistens the sensor 10 and spreads thereon immediately, and thus the rate of change in the sensing signal S in the predetermined first period T1 until the first time point t1 becomes larger than the first gradient threshold $\alpha$th1, but the sensing signal S does not fall below the second threshold Sth2 in the predetermined second period T2 from the first time point t1. Accordingly, in this case, the controller 20 determines that the finger UF is not in close proximity to or not in contact with the sensor 10 (i.e., determines that the object sensed by the sensor 10 is not a human body) and does not generate an operation signal for operating the equipment to be operated.

On the other hand, when the sensing signal S generated according to the electrostatic capacitance detected by the sensor 10 exceeds the first threshold Sth1 at the first time point t1, the rate of change in the sensing signal in the first period T1 until the first time point t1 is larger than the first gradient threshold $\alpha$th1, and the sensing signal S falls below the second threshold Sth2 at a second time point t2 in the second period T2 from the first time point t1, the controller 20 determines that the finger UF in close proximity to or in contact with the sensor 10.

For example, when the user touches the sensor 10 with the pad of the finger UF, as illustrated in FIG. 8, in order to operate the equipment (e.g., a lighting device) to be operated, the sensing signal S from the sensor 10 exhibits a curve UF1 as indicated by a solid line in FIG. 9. In this case, the finger UF of the user begins to come close to the sensor electrode 12 at the time point t0, and since the area of contact between the finger UF and the sensor 10 is large from the beginning, the rate of change in the sensing signal S in the predetermined first period T1 until the first time point t1 becomes larger than the first gradient threshold $\alpha$th1, as in the case in which a liquid droplet adheres to the sensor 10. However, since the finger UF of the user moves away from the sensor 10 in about one second, the sensing signal S falls below the second threshold Sth2 in the predetermined second period T2 from the first time point t1. Accordingly, in this case, the controller 20 determines that the finger UF is in close proximity to or in contact with the sensor 10, generates an operation signal for operating the equipment to be operated, and outputs the operation signal to the equipment. Thus, the user can perform an intended operation on the equipment to be operated. For example, the user can perform on/off control on a lighting device.

When the speed of the operation of pressing the finger UF against the sensor 10 is high, as illustrated in FIG. 7, the sensing signal S from the sensor 10 exhibits the curve UF1, as indicated by the solid line in FIG. 9. Accordingly, in this case, it is also determined that the finger UF is in close proximity to or in contact with the sensor 10.

Also, in a case in which the user operates the equipment to be operated, when the user touches the sensor 10 with the tip of the finger UF or when the speed of the user's operation of touching the sensor 10 is not high, the sensing signal S generated by the sensor 10 exhibits a curve UF2 indicated by a dashed line. In this case, the sensing signal S exceeds the first threshold Sth1 at a first time point t1' and then falls below the second threshold Sth2 at a second time point t2'. When the rate of change in the sensing signal S is smaller than the first gradient threshold $\alpha$th1, the controller 20 determines that the finger UF is in close proximity to or in contact with the sensor 10 at the first time point t1' at which the first threshold Sth1 is exceeded, generates an operation signal for operating the equipment to be operated, and outputs the operation signal to the equipment.

In the present embodiment, the first period T1 refers to a period of time from the time point t0 at which the sensing signal S begins to change to a time point at which the sensing signal S exceeds the first threshold Sth1. The second period T2 is, for example, about 1 second. The second period T2 is not limited to about 1 second, as long as it is a predetermined period considering the time from when the finger comes in close proximity to or in contact with the sensor 10 until the finger leaves the sensor 10 during the user's operation on the operation switch 1, and may be about 2 or 3 seconds.

Also, in the present embodiment, the value of the electrostatic capacitance (or the sensing signal S) used for the determination as to close proximity or contact of the finger is a relative value of a detection value of an electrostatic capacitance, detected by the sensor 10, relative to a reference value. The reference value is, for example, an average value of values of the electrostatic capacitance in a predetermined period for which it is determined that no finger is in close proximity or in contact, but is not limited to this value.

As described above, in the operation switch 1 according to the present embodiment, in a case in which the sensing signal S generated according to the electrostatic capacitance detected by the sensor 10 exceeds the first threshold Sth1 at the first time point t1, when the rate of change in the sensing signal S in the predetermined first period T1 until the first time point t1 is larger than the first gradient threshold $\alpha$th1, and the sensing signal S does not fall below the second threshold Sth2 in the predetermined second period T2 from the first time point t1, the controller 20 determines that the finger UF is not in close proximity or not in contact (i.e., determines that the object sensed by the sensor 10 is not a human body).

This can suppress malfunction of the operation switch 1 which is caused by adherence of a liquid droplet or the like and can suppress the operation switch responding to an operation unintended by the user, regardless of the way of bringing the finger UF close to the sensor 10 or the operation speed of the finger UF. Accordingly, it is possible to realize an operation switch that can precisely detect the user's operation.

First Modification of First Embodiment

Figure 10:
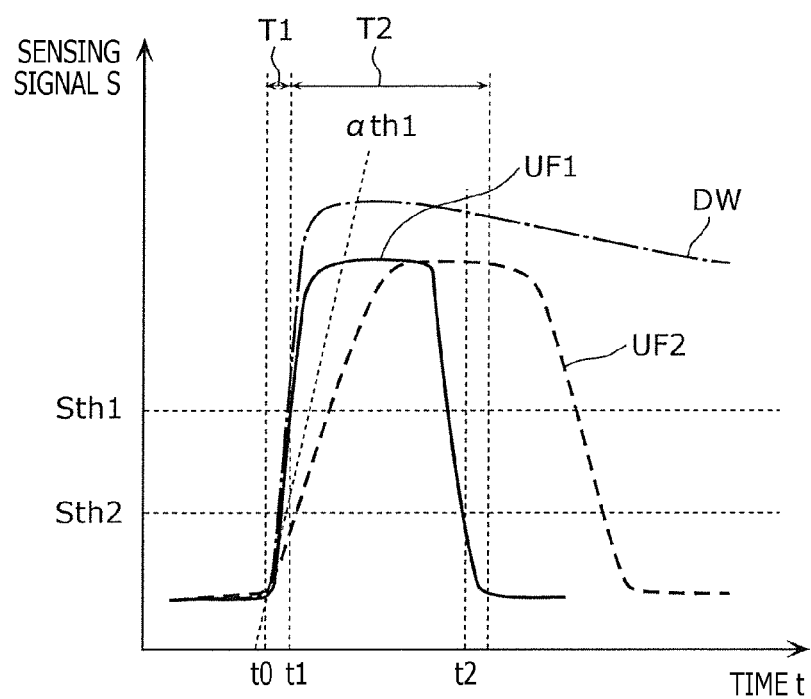
FIG. 10 is a graph for describing the control method for the operation switch according to a first modification of the first embodiment.

Next, an operation switch according to a first modification of a first embodiment will be described next with reference to FIG. 10. FIG. 10 is a graph for describing a control method for the operation switch according to the first modification of the first embodiment.

As illustrated in FIG. 10, in the operation switch in this modification, in a case in which the sensing signal S generated according to the electrostatic capacitance detected by the sensor 10 exceeds the first threshold Sth1 at the first time point t1, when the rate of change in the sensing signal S in the predetermined first period T1 until the first time point t1 is larger than the first gradient threshold $\alpha$th1, and the sensing signal S does not fall below the second threshold Sth2 in the predetermined second period T2 from the first time point t1, the controller 20 determines that no finger is in close proximity or in contact, as in the first embodiment.

The thresholds for the sensing signal S in the operation switch in this modification differ from those in the operation switch 1 in the first embodiment. Specifically, although the first threshold Sth1 and the second threshold Sth2 are the same in the operation switch 1 in the first embodiment, the first threshold Sth1 and the second threshold Sth2 in the operation switch in this modification differ from each other, as illustrated in FIG. 10. More specifically, in this modification, the first threshold Sth1 is larger than the second threshold Sth2.

Thus, the time from the first time point t1 to the second time point t2 becomes larger than that in the first embodiment, as illustrated in FIG. 10. As a result, it is possible to more reliably determine whether or not the sensing signal S generated by the sensor 10 is due to a liquid droplet from the user's finger.

Thus, according to the operation switch in this modification, malfunction of the operation switch which is caused by adherence of a liquid droplet or the like can be more reliably prevented than the operation switch in the first embodiment, and it is possible to further suppress the operation switch responding to an operation unintended by the user. This makes it possible to realize an operation switch that can more precisely sense the user's operation.

Second Modification of First Embodiment

Figure 11:
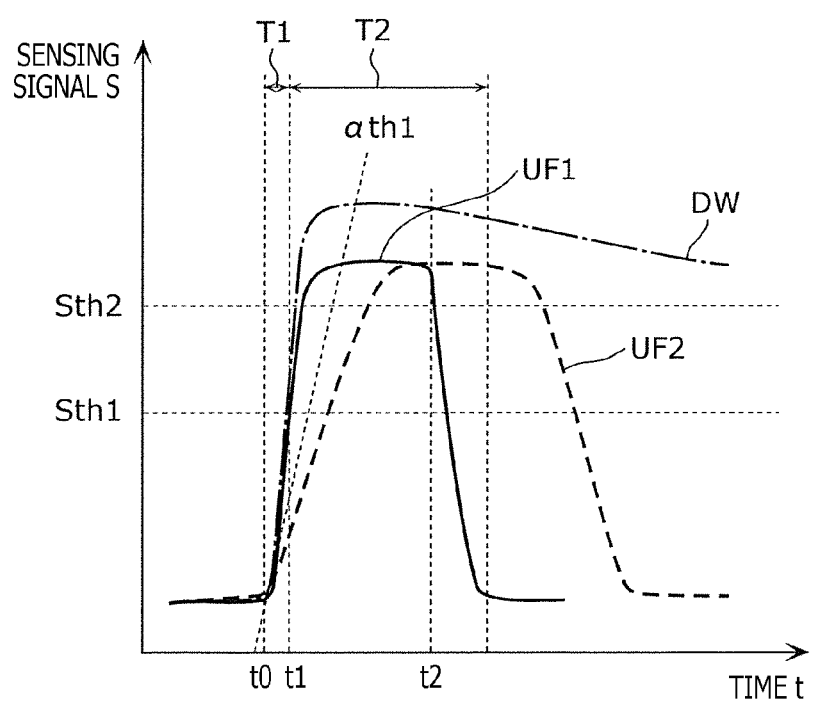
FIG. 11 is a graph for describing the control method for the operation switch according to a second modification of the first embodiment.

Next, an operation switch according to a second modification of the first embodiment will be described with reference to FIG. 11. FIG. 11 is a graph for describing a control method for an operation switch according to the second modification of the first embodiment.

As illustrated in FIG. 11, in the operation switch in this modification, in a case in which the sensing signal S generated according to the electrostatic capacitance detected by the sensor 10 exceeds the first threshold Sth1 at the first time point t1, when the rate of change in the sensing signal S in the predetermined first period T1 until the first time point t1 is larger than the first gradient threshold $\alpha$th1, and the sensing signal S does not fall below the second threshold Sth2 in the predetermined second period T2 from the first time point t1, the controller 20 determines that no finger is in close proximity or in contact, as in the first embodiment.

The thresholds for the sensing signal S in the operation switch in this modification differ from those in the operation switch 1 in the first embodiment. More specifically, although the first threshold Sth1 and the second threshold Sth2 are the same in the operation switch 1 in the first embodiment, the first threshold Sth1 and the second threshold Sth2 in the operation switch in this modification differ from each other, as in the first modification. However, in this modification, the first threshold Sth1 is smaller than the second threshold Sth2, as illustrated in FIG. 11, unlike the first modification.

Thus, the time from the first time point t1 to the second time point t2 becomes smaller than that in the first embodiment, as illustrated in FIG. 11. More specifically, the sensing signal S generated by the sensor 10 exceeds the first threshold Sth1 at the first time point t1 and then falls below the second threshold Sth2 at the second time point t2 in the second period T2 from the first time point t1. As a result, it is possible to improve responsiveness of the operation switch.

Thus, according to the operation switch in this modification, it is possible to prevent malfunction of the operation switch which is caused by adherence of a liquid droplet or the like, and it is possible to suppress responding to an operation unintended by the user. In addition, it is also possible to realize an operation switch having improved responsiveness.

Second Embodiment

Next, a description will be given of an operation switch according to a second embodiment.

A method for control performed by the controller 20 in the operation switch according to the second embodiment differs from that in the operation switch 1 according to the first embodiment.

Although malfunction of the operation switch 1 when a liquid droplet adheres to the sensor 10 can be suppressed with the control method for the operation switch 1 in the first embodiment, it is difficult to suppress malfunction when dew forms on the sensor 10 or steam adheres thereto.

Figure 12:
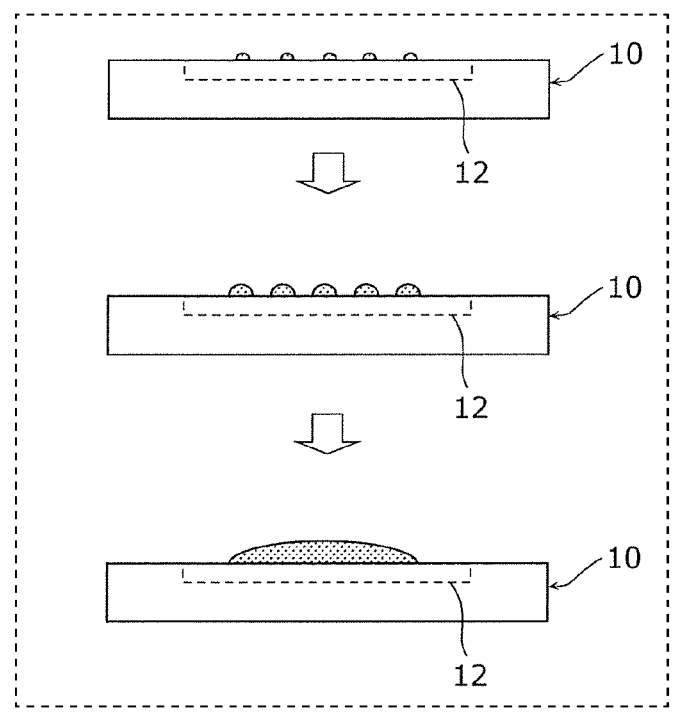
FIG. 12 is a schematic diagram schematically illustrating a state when dew forms on the sensor or steam adheres thereto.
Figure 13:
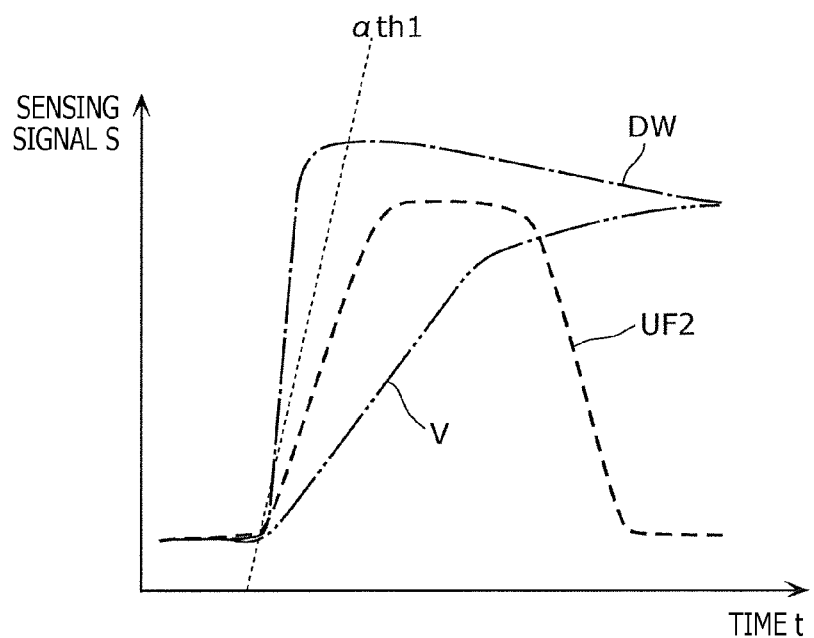
FIG. 13 is a graph illustrating one example of the sensing signal in a case in which dew forms on the sensor or steam adheres thereto.

As illustrated in FIG. 12, for example, when dew forms on the sensor 10 or steam adheres thereto, the amount of liquid droplets on the sensor 10 increases gradually. In this case, the sensing signal S generated by the sensor 10 exhibits a curve V indicated by a chain double-dashed line in FIG. 13. That is, in this case, the gradient of the sensing signal S is small, as illustrated in FIG. 13.

In this case, when the gradient of the sensing signal S in the curve V becomes smaller than the first gradient threshold αth1, there is a possibility that it is determined that this change in the sensing signal S is due to an operation of the user's finger. That is, there is a possibility that the operation switch 1 responses to an operation unintended by the user and the operation switch 1 malfunctions.

Accordingly, in the operation switch in the present embodiment, a sensing determination algorithm as described below is used to determine whether or not the finger is in close proximity to or in contact with the sensor 10 to thereby suppress malfunction in the case of dew formation on the sensor 10 or adherence of steam thereto.

Figure 14:
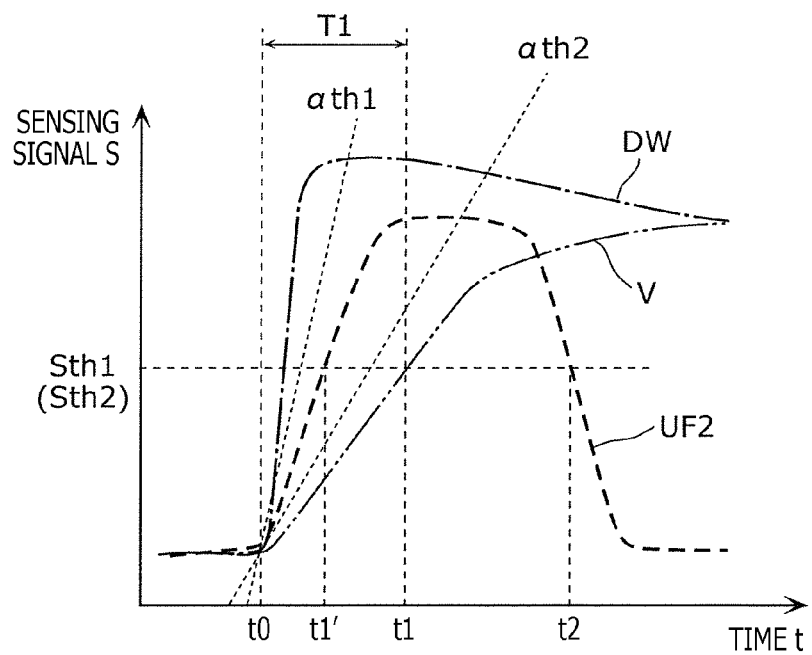
FIG. 14 is a graph for describing a control method for an operation switch according to a second embodiment.

A method for control performed by the controller 20 in the operation switch in the present embodiment will be described below with reference to FIG. 14. FIG. 14 is a graph for describing a control method for the operation switch according to the second embodiment.

In the operation switch in the present embodiment, when the rate of change in the sensing signal S in the predetermined first period T1 until the first time point t1 is smaller than the second gradient threshold αth2 (which indicates a smaller gradient than the first gradient threshold αth1), as illustrated in FIG. 14, the controller 20 determines that no finger is in close proximity or in contact, and when the rate of change in the sensing signal S in the first period T1 is smaller than the first gradient threshold αth1 and is larger than the second gradient threshold αth2, the controller 20 determines that the finger is in close proximity or in contact. The second gradient threshold αth2 is one example of a "second rate" in the present disclosure.

For example, when dew forms on the sensor 10 or steam adheres thereto, the sensing signal S generated by the sensor 10 exhibits a curve V as indicated by a chain double-dashed line in FIG. 14. In this case, the rate of change in the sensing signal S (e.g., the graph gradient of the sensing signal S) in the predetermined first period T1 until the first time point t1 becomes smaller than the second gradient threshold αth2, which indicates a smaller gradient than the first gradient threshold αth1. In this case, the controller 20 determines that no finger is in close proximity to or in contact with the sensor 10 and does not generate an operation signal for operating the equipment to be operated.

On the other hand, when the user touches the sensor 10 with the tip of the finger UF in order to operate the equipment to be operated or the speed of the user's operation of pressing the sensor 10 is not high, the sensing signal S generated by the sensor 10 exhibits a curve UF2 indicated by a dashed line in FIG. 14. In this case, the sensing signal S exceeds the first threshold Sth1 at the first time point t1' and then falls below the second threshold Sth2 at the second time point t2. When the rate of change in the sensing signal S is smaller than the first gradient threshold αth1 and is larger than the second gradient threshold αth2, the controller 20 determines that the finger is in close proximity to or in contact with the sensor 10 at the first time point t1' at which the first threshold Sth1 is exceeded, generates an operation signal for operating the equipment to be operated, and outputs the operation signal to the equipment. Thus, the user can perform an intended operation on the equipment to be operated.

When the user touches the sensor 10 with the pad of the finger UF, as illustrated in FIG. 8, the controller 20 can determine that the finger UF is in close proximity to or in contact with the sensor 10, by performing control that is similar to that in the first embodiment.

As described above, in the operation switch according to the present embodiment, when the rate of change in the sensing signal S in the predetermined first period T1 until the first time point t1 is smaller than the second gradient threshold αth2, it is determined that no finger is in close proximity or in contact, and when the rate of change in the sensing signal S in the first period T1 is smaller than the first gradient threshold αth1 and is larger than the second gradient threshold αth2, it is determined that the finger is in close proximity or in contact. That is, even when the rate of change in the sensing signal S (e.g., the graph gradient of the sensing signal S) in the first period T1 is smaller than the first gradient threshold αth1, it is determined that no finger is in close proximity or in contact, as long as the sensing signal S is smaller than the second gradient threshold αth2.

This makes it possible to suppress malfunction in the case of dew formation on the sensor 10 or adherence of steam thereto and makes it possible to suppress the operation switch responding to an operation unintended by the user. Accordingly, it is possible to realize an operation switch that can more precisely sense the user's operation.

Although, in the present embodiment, a determination as to whether or not the user's finger is in close proximity or in contact is made using two gradient thresholds, that is, the first gradient threshold αth1 and the second gradient threshold αth2, the present disclosure is not limited thereto. For example, three or more gradient thresholds may be used to determine whether or not the user's finger is in close proximity or in contact.

Third Embodiment

Next, a description will be given of an operation switch according to a third embodiment.

A method for control performed by the controller 20 in the operation switch according to the third embodiment differs from that in the operation switch 1 according to the first embodiment.

A control method for the operation switch 1 in the first embodiment can suppress malfunction of the operation switch 1 when a liquid droplet adheres to the sensor 10.

Figure 15:
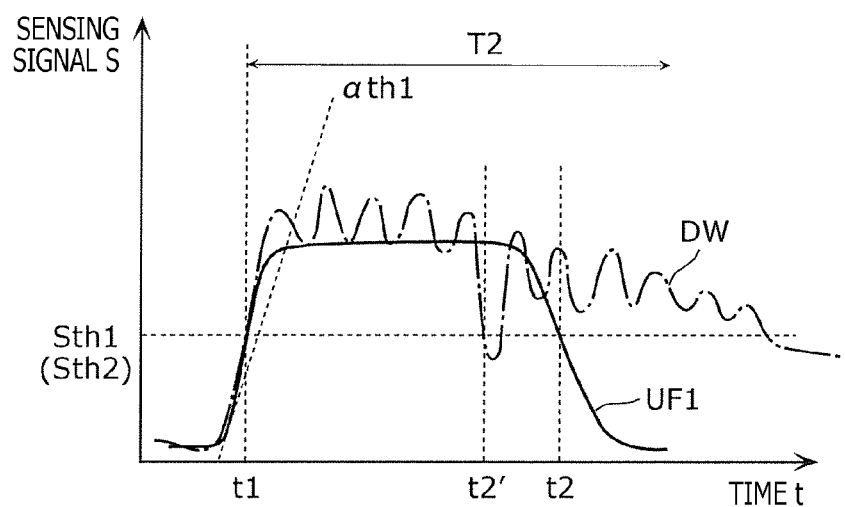
FIG. 15 is a graph for describing one example of the sensing signal when the waveform of the sensing signal fluctuates suddenly.

However, depending on the amount of liquid droplets that adhere or a path through which a liquid droplet flows, the waveform of the sensing signal S may change while fluctuating, as illustrated in FIG. 15. For example, the sensing signal S may fall below the second threshold Sth2 instantaneously at the time point t2' in the period T2. For example, when a plurality of liquid droplets adhere to the sensor 10 and a region in the vicinity of the sensor 10, and the liquid droplets flow through different paths at different speeds, the amount of liquid droplets that lie on the sensor 10 changes with time, and thus the sensing signal S may fall below the second threshold Sth2 instantaneously. In this case, with the control method for the operation switch 1 in the first embodiment, there is a possibility that it is determined that the change in the sensing signal S is due to close proximity or contact of the finger.

Accordingly, in the operation switch in the present embodiment, a sensing determination algorithm as described below is further added to the control method for the operation switch in the first embodiment to determine whether or not the finger is in close proximity to or in contact with the sensor 10.

Figure 16:
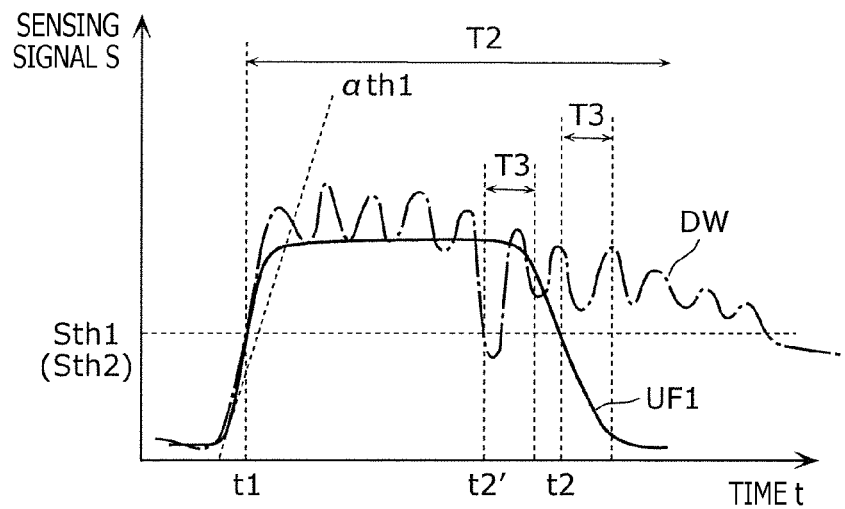
FIG. 16 is a graph for describing a control method for an operation switch according to a third embodiment.

A method for control performed by the controller 20 in the operation switch in the present embodiment will be described below with reference to FIG. 16. FIG. 16 is a graph for describing a control method for the operation switch according to the third embodiment.

In the operation switch in the present embodiment, as illustrated in FIG. 16, in a case in which the rate of change in the sensing signal S in the predetermined first period T1 until the first time point t1 is larger than the first gradient threshold $\alpha th1$, and the sensing signal S falls below the second threshold Sth2 in the second period T2 from the first time point t1, when the duration of the state in which the sensing signal S falls below the second threshold Sth2 is shorter than a predetermined third period T3, the controller 20 determines that no finger is in close proximity or in contact, and when the duration of the state in which the sensing signal S falls below the second threshold Sth2 is longer than or equal to the predetermined third period T3, the controller determines that the finger is in close proximity or in contact. The third period T3 is, for example, about 0.1 second and is not limited thereto.

For example, even in a case in which the waveform of the sensing signal S fluctuates and the sensing signal S falls below the second threshold Sth2 instantaneously at the time point t2' in the second period T2, as indicated by a curve DW represented by a dashed-dotted line illustrated in FIG. 16, when the duration of the state in which the sensing signal S falls below the second threshold Sth2 in the second period T2 after exceeding the first threshold Sth1 is shorter than the predetermined third period T3, the controller 20 determines that no finger is in close proximity to or in contact with the sensor 10 and does not generate an operation signal for operating the equipment to be operated.

On the other hand, in a case in which the duration of the state in which the sensing signal S falls below the second threshold Sth2 in the second period T2 after exceeding the first threshold Sth1 is longer than or equal to the predetermined third period T3, when the sensing signal S falls below the second threshold Sth2 at the second time point t2 in the second period T2 from the first time point t1, the controller 20 determines that the finger is in close proximity or in contact, generates an operation signal for operating the equipment to be operated, and outputs the operation signal to the equipment, as in the first embodiment. Thus, the user can perform an intended operation on the equipment to be operated.

As described above, in the operation switch according to the present embodiment, in a case in which the rate of change in the sensing signal S in the first period T1 is larger than the first gradient threshold $\alpha th1$, and the sensing signal S falls below the second threshold Sth2 in the second period T2, it is determined that no finger is in close proximity or in contact, when the duration of the state in which the sensing signal S falls below the second threshold Sth2 is shorter than the predetermined third period T3, and it is determined that the finger is in close proximity or in contact, when the duration of the state in which the sensing signal S falls below the second threshold Sth2 is longer than or equal to the predetermined third period T3.

Thus, in a case in which a plurality of liquid droplets adhere to the sensor 10 and a region in the vicinity of the sensor 10, even when the sensing signal S fluctuates and falls below the second threshold Sth2 instantaneously in the second period T2, it is possible to suppress malfunction indicating that the finger is in close proximity or in contact, and it is possible to suppress the operation switch responding to an operation unintended by the user. Accordingly, it is possible to realize an operation switch that can more precisely sense the user's operation.

Although the first threshold Sth1 and the second threshold Sth2 are the same in the present embodiment, the first threshold Sth1 and the second threshold Sth2 may be different from each other, as in the first and second modifications of the first embodiment. That is, the first and second modifications of the first embodiment may be applied to the present embodiment.

Fourth Embodiment

Next, a description will be given of an operation switch according to a fourth embodiment.

A method for control performed by the controller 20 in the operation switch according to the fourth embodiment differs from that in the operation switch 1 according to the first embodiment.

The control method for the operation switch 1 in the first embodiment can suppress malfunction of the operation switch 1 when a liquid droplet adheres to the sensor 10.

Figure 17:
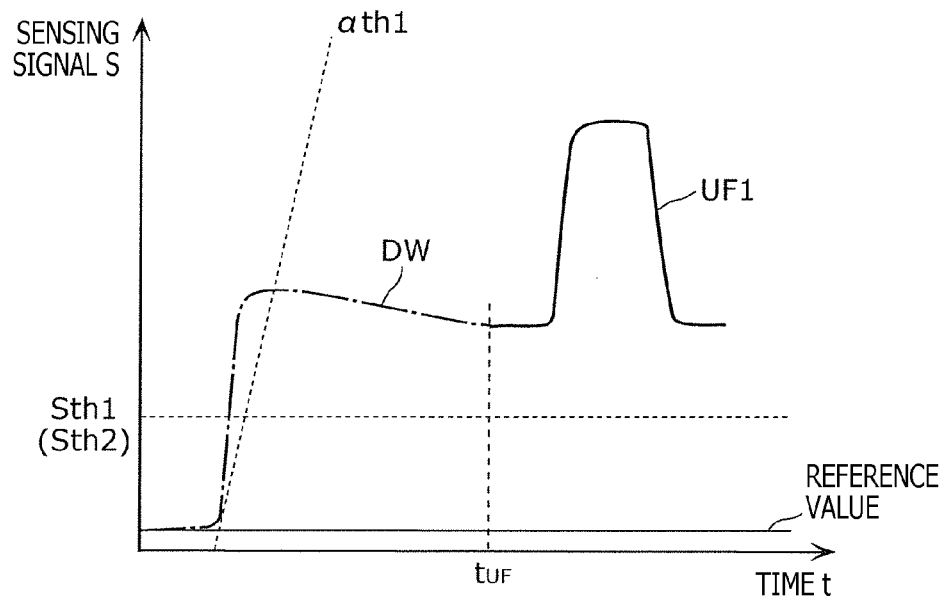
FIG. 17 is a graph illustrating one example of the sensing signal when a user operates the sensor while a liquid droplet adheres to the sensor.

However, for example, in a case in which the user operates the sensor 10 while a liquid droplet adheres to the sensor 10, even when the user brings his or her finger into close proximity to or into contact with the sensor 10 at a time point $t_{UF}$, as illustrated in FIG. 17, the sensing signal S changes in a range that is larger than the first threshold Sth1 and the second threshold Sth2. Thus, in the control method for the operation switch 1 in the first embodiment, it is not determined that the finger is in close proximity or in contact. That is, when the sensing signal S exceeds the first threshold Sth1, and it is temporarily determined that this change in the sensing signal S is due to adherence of a liquid droplet or the like and is not due to close proximity or contact of the finger, the sensing signal S changes in a range that is larger than the first threshold Sth1 and the second threshold Sth2 until the sensing signal S returns to its original value (or a value smaller than the first threshold Sth1), even if the user brings his or her finger into close proximity to or into contact with the sensor 10 and the electrostatic capacitance changes properly. Thus, it is not determined that the change in the sensing signal S is due to an operation performed by the user's finger.

Accordingly, in the operation switch in the fourth embodiment, a sensing determination algorithm as described below is used to determine whether or not the finger is in close proximity to or in contact with the sensor 10.

Figure 18:
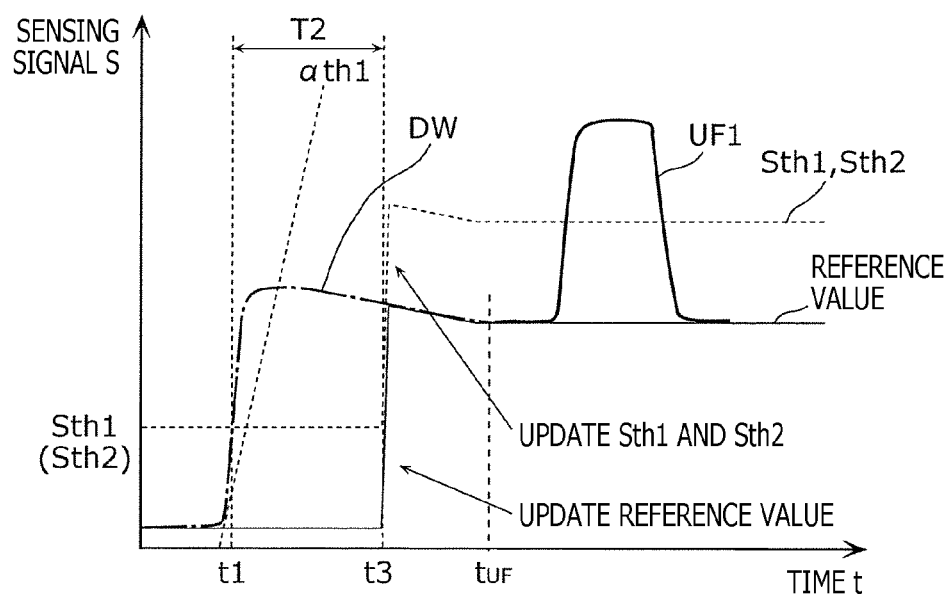
FIG. 18 is a graph for describing a control method for an operation switch according to a fourth embodiment.

A method for control performed by the controller 20 in the operation switch in the fourth embodiment will be described below with reference to FIG. 18. FIG. 18 is a graph for describing a control method for the operation switch according to the fourth embodiment.

In the operation switch in the present embodiment, when the sensing signal S is larger than or equal to the first threshold Sth1, and it is determined that no finger is in close proximity or in contact at a predetermined time point, the controller 20 updates a reference value to the value of the sensing signal S obtained at the predetermined time point.

In this case, the value of an electrostatic capacitance (or the sensing signal S) used for the determination as to close proximity or contact of the finger is the relative value of a detection value of the electrostatic capacitance, which is detected by the sensor 10, relative to the reference value, as in the first embodiment. The reference value is, for example, an average value of values of the electrostatic capacitance in a predetermined period for which it is determined that no finger is in close proximity or in contact.

For example, when a liquid droplet adheres to the sensor 10, the sensing signal S generated by the sensor 10 exhibits a curve DW as indicated by a dashed-dotted line in FIG. 18. In this case, when the sensing signal S exceeds the first threshold Sth1, and the sensing signal S does not fall below the second threshold Sth2 in the predetermined second period T2 from the first time point t1 to a time point t3, the controller 20 in the present embodiment temporarily confirms that no finger is in close proximity or in contact at the time point t3 and updates the reference value to the value of the sensing signal S obtained at the time point t3. In this case, at the same time the reference value is updated, the controller 20 also updates the values of the first threshold Sth1 and the second threshold Sth2 by an amount corresponding to the updated amount of the reference value.

After the reference value, the first threshold Sth1, and the second threshold Sth2 are updated, a determination as to whether or not the user's finger is in close proximity or in contact can be made using a control method that is analogous to that in the first embodiment.

As described above, in the operation switch according to the present embodiment, when the sensing signal S is larger than or equal to the first threshold Sth1, and it is determined that no finger is in close proximity or in contact at a predetermined time point, the reference value is updated to the value of the sensing signal S obtained at the predetermined time point.

Thus, for example, even when the state in which a liquid droplet adheres to the sensor 10 continues, it is possible to precisely sense the user's operation.

Although the first threshold Sth1 and the second threshold Sth2 are the same in the present embodiment, the first threshold Sth1 and the second threshold Sth2 may be different from each other, as in the first and second modifications of the first embodiment. Also, the update of the reference value, the first threshold Sth1, and the second threshold Sth2 may be performed a plurality of times. The reference value can be calculated by the controller 20, as needed, and can be changed according to the electrostatic capacitance detected by the sensor 10, as appropriate.

Modification of Fourth Embodiment

Next, a description will be given of an operation switch according to a modification of a fourth embodiment.

Although the control method for a case in which the state in which a liquid droplet adheres to the sensor 10 continues has been described in the fourth embodiment, a description in this modification of the fourth embodiment will be given of a control method for a case in which the state in which a liquid droplet adheres to the sensor 10 owing to dew formation on the sensor 10 or adherence of steam thereto continues.

When dew forms on the sensor 10 or steam adheres thereto, use of the control method for the operation switch 1 in the second embodiment can suppress malfunction due to the dew formation on the sensor 10 or adherence of the steam and can reliably sense the user's operation. That is, a determination as to whether or not the user's finger is in close proximity or in contact is made using the plurality of gradient thresholds, that is, the first gradient threshold $\alpha$th1 and the second gradient threshold $\alpha$th2, thereby making a determination as to whether or not a change in the sensing signal S is due to the user's operation.

In addition, when the control method in the first embodiment is applied to the control method in the second embodiment, malfunction of the operation switch 1 can be suppressed regardless of the way of bringing the finger close to the sensor 10 or the operation speed of the finger. In this case, as in the first embodiment, a determination as to whether or not a change in the sensing signal S is due to the user's operation can be made depending on whether or not the sensing signal S falls below the second threshold th2 after exceeding the first threshold Sth1.

Figure 19:
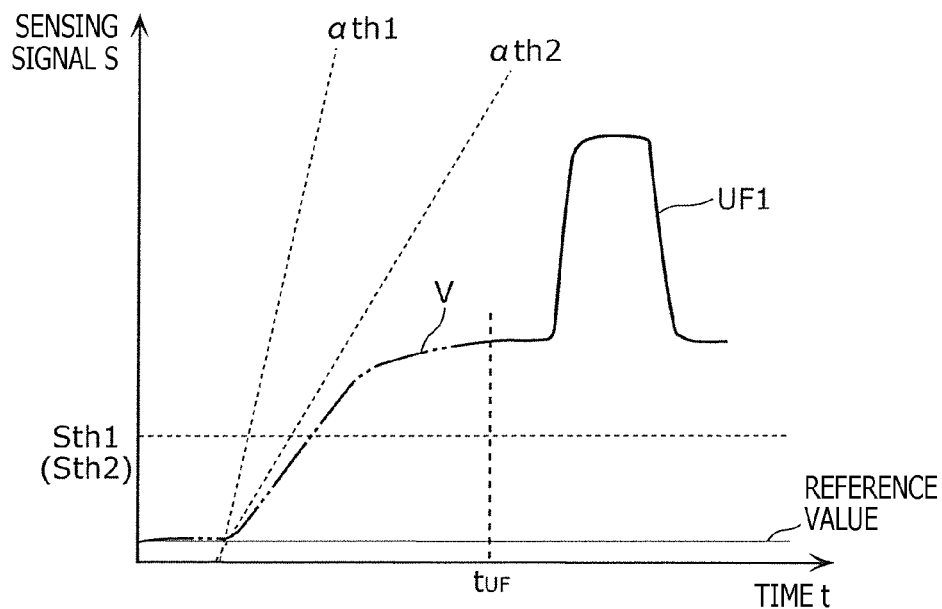
FIG. 19 is a graph illustrating one example of the sensing signal when the user operates the sensor while dew forms on the sensor or steam adheres thereto.

However, for example, in a case in which the user operates the sensor 10 when the state in which a liquid droplet adheres to the sensor 10 owing to dew formation on the sensor 10 or adherence of steam thereto continues, even when the user brings his or her finger into close proximity to or into contact with the sensor 10 at the time point $t_{UF}$, the sensing signal S changes in a larger range than those of the first threshold Sth1 and the second threshold Sth2, as illustrated in FIG. 19. Thus, in the control method for the operation switch 1 in the first and second embodiments, it is not determined that the finger is in close proximity or in contact. That is, when the sensing signal S exceeds the first threshold Sth1, and it is temporarily determined that the finger is not in close proximity or not in contact owing to adherence of a liquid droplet or the like, the sensing signal S changes in a range that is larger than those of the first threshold Sth1 and the second threshold Sth2 until the sensing signal S returns to its original value (or a smaller value than first threshold Sth1), even if the user brings his or her finger into close proximity to or into contact with the sensor 10 and the electrostatic capacitance changes properly. Thus, it is not determined that the change in the sensing signal S is due to an operation performed by the user's finger.

Accordingly, in the operation switch in this modification, a sensing determination algorithm as described below is used to determine whether or not the finger is in close proximity to or in contact with the sensor 10.

Figure 20:
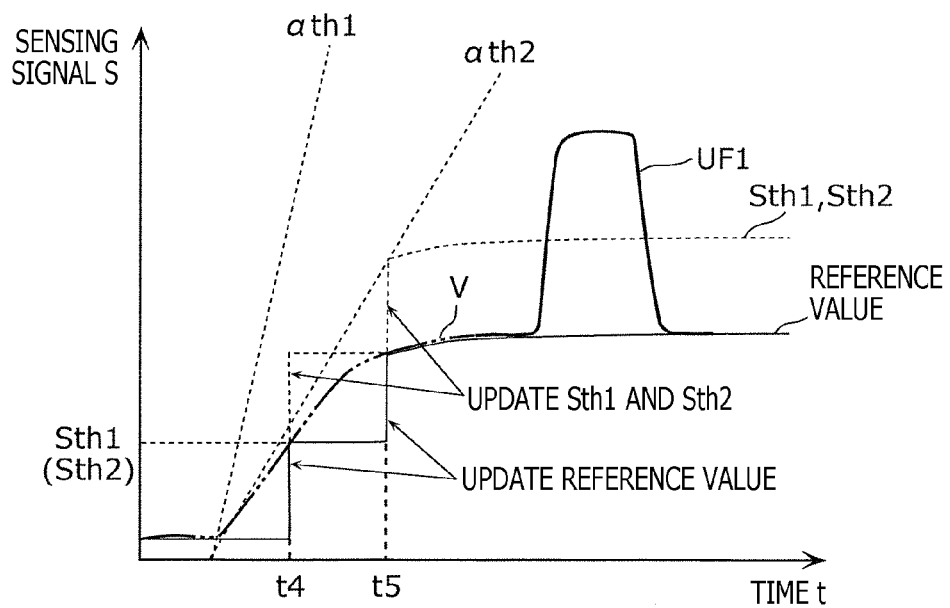
FIG. 20 is a graph for describing a control method for an operation switch according to a modification of the fourth embodiment.

A method for control performed by the controller 20 in the operation switch in this modification will be described below with reference to FIG. 20. FIG. 20 is a graph for describing a control method for the operation switch according to the modification of the fourth embodiment.

The control method for the operation switch in this modification is analogous to the control method for the operation switch in the fourth embodiment. Specifically, as illustrated in FIG. 20, when the sensing signal S is larger than or equal to the first threshold Sth1, and the controller 20 determines that no finger is in close proximity or in contact at a predetermined time point, the controller 20 updates the reference value to the value of the sensing signal S obtained at the predetermined time point.

For example, when dew forms on the sensor 10 or steam adheres thereto, the sensing signal S generated by the sensor 10 exhibits a curve V indicated by a chain double-dashed line illustrated in FIG. 20. In this case, when the sensing signal S reaches the first threshold Sth1 (i.e., "sensing signal S"="first threshold Sth1") at a time point t4, the controller 20 in this modification temporarily confirms that no finger is in close proximity or in contact at the time point t4 and updates the reference value to the value of the sensing signal S obtained at the time point t4. In this case, at the same time the reference value is updated, the controller 20 also updates the values of the first threshold Sth1 and the second threshold Sth2 by an amount corresponding to the updated amount of the reference value.

In addition, when the sensing signal S reaches the updated first threshold Sth1 again at a time point t5, the controller 20 re-confirms that no finger is in close proximity or in contact at the time point t5 and updates the reference value to the value of the sensing signal S obtained at the time point t5. In this case, at the same time the reference value is updated, the values of the first threshold Sth1 and the second threshold Sth2 are also updated by an amount corresponding to the updated amount of the reference value.

After the reference value, the first threshold Sth1, and the second threshold Sth2 are updated, a determination as to whether or not the user's finger is in close proximity or in contact can be made using a control method that is analogous to that in the first or second embodiment.

As described above, in the operation switch according to this modification, when the sensing signal S is larger than or equal to the first threshold Sth1, and it is determined that no finger is in close proximity or in contact at a predetermined time point, the reference value is updated to the value of the sensing signal S obtained at the predetermined time point.

As a result, for example, even when the state in which a liquid droplet adheres to the sensor 10 owing to dew formation on the sensor 10 or adherence of steam thereto continues, it is possible to precisely sense the user's operation.

Although the first threshold Sth1 and the second threshold Sth2 are the same in the present embodiment, the first threshold Sth1 and the second threshold Sth2 may be different from each other, as in the first and second modifications of the first embodiment. The number of times the reference value, the first threshold Sth1, and the second threshold Sth2 are updated is not limited to two, and the update may be performed once or three times or more.

Other Modifications

Although the operation switch according to the present disclosure has been described above in conjunction with the first to fourth embodiments, the present disclosure is not limited to the first to fourth embodiments.

For example, although, in the first to fourth embodiments, a liquid droplet, dew, steam, and so on have been described as objects that cause malfunction of the sensor 10 and that are to be sensed, the present disclosure is not limited thereto. Also, although, in the first to fourth embodiments, the object to be sensed by the sensor 10 is the user's finger, the present disclosure is not limited thereto. The object to be sensed by the sensor 10 may be anything having an electrostatic capacitance that changes relative to the sensor electrode 12.

In addition, modes obtained by making various modifications conceived by those skilled in the art to each embodiment described above or modes realized by arbitrarily combining the constituent elements and the functions in the first to fourth embodiments within a scope that does not depart from the spirit of the present disclosure are also encompassed by the present disclosure.

Specifically, the controller 20 in the operation switch may perform control obtained by combining all the control methods in the first to fourth embodiments and the modifications or may perform control obtained by combining the control methods in some of the first to fourth embodiments and the modifications.

Overviews of Embodiments

An operation switch according to one embodiment includes: an electrostatic capacitive sensor that detects an electrostatic capacitance by using a sensor electrode to thereby sense close proximity or contact of a human body; and a controller that generates an operation signal on the basis of a sensing signal generated according to the electrostatic capacitance detected by the sensor. In a case in which the sensing signal exceeds a first threshold at a first time point, when the rate of change in the sensing signal in a predetermined first period until the first time point is larger than a first gradient threshold, and the sensing signal does not fall below a second threshold in a predetermined second period from the first time point, the controller determines that the human body is not in close proximity or not in contact.

For example, when the rate of change in the sensing signal in the first period is smaller than a second gradient threshold, which indicates a smaller gradient than the first gradient threshold, the controller may determine that the human body is not in close proximity or not in contact. When the rate of change in the sensing signal in the first period is smaller than the first gradient threshold and is larger than the second gradient threshold, the controller may determine that the human body is in close proximity or in contact.

For example, in a case in which the rate of change in the sensing signal in the first period is larger than the first gradient threshold, and the sensing signal falls below the second threshold in the second period, when the duration of the state in which the sensing signal falls below the second threshold is shorter than a predetermined third period, the controller may determine that the human body is not in close proximity or not in contact, and when the duration of the state in which the sensing signal falls below the second threshold is longer than or equal to the predetermined third period, the controller may determine that the human body is in close proximity or in contact.

For example, the first threshold and the second threshold may be the same.

For example, the first threshold may be larger than the second threshold.

For example, the first threshold may be smaller than the second threshold.

For example, the value of the electrostatic capacitance used for the determination as to close proximity or contact of the human body is a relative value of a detection value of the electrostatic capacitance relative to a reference value, the detection value being detected by the sensor, and the reference value may be an average value of values of the electrostatic capacitance in a predetermined period for which it is determined that the human body is not in close proximity or not in contact.

For example, when the sensing signal is larger than or equal to the first threshold, and the controller determines that the human body is not in close proximity or not in contact at a predetermined time point, the controller may update the reference value to the value of the sensing signal obtained at the predetermined time point.

The controller includes, for example, a semiconductor device, a semiconductor integrated circuit (IC), a large-scale integration (LSI), or an electronic circuit obtained by combining the semiconductor device, the semiconductor IC, and the LSI. The LSI or the IC may be integrated into one chip or may be a combination of a plurality of chips. For example, the functional blocks may be integrated into one chip. Each of the LSI and the IC can be called, for example, a system LSI, a very large scale integration (VLSI), or an ultra large scale integration (ULSI), depending on the degree of the integration. The controller may include a comparator that compares a detection value with a fixed value and also may include a timer or counter that measures a time point.

The present disclosure can be used, for example, for sensing motion of a human body, an object, or the like and thus can be applied to an operation switch and so on for users to operate equipment.

What is claimed is:

1. An operation switch comprising:
an electrostatic capacitance sensor that generates a sensing signal in response to approach or contact of an object; and
a controller that
calculates, when the sensing signal exceeds a first threshold at a first time point, a rate of change in a magnitude of the sensing signal in a first period including the first time point,
determines, when the rate of change is not larger than a first rate, the object is a human body,
determines, when the rate of change is larger than the first rate and further when the sensing signal falls below a second threshold in a second period subsequent to the first period, the object is a human body, and
determines, when the rate of change is larger than the first rate and further when the sensing signal does not fall below the second threshold in the second period, the object is not a human body.

2. The operation switch according to claim 1, wherein the first time point is an end point of the first period.

3. The operation switch according to claim 1, wherein the first period is immediately followed by the second period.

4. The operation switch according to claim 1, wherein the first threshold and the second threshold are the same.

5. The operation switch according to claim 1, wherein the first threshold is larger than the second threshold.

6. The operation switch according to claim 1, wherein the first threshold is smaller than the second threshold.

7. The operation switch according to claim 1, wherein the controller further sets a reference value based on the magnitude of the sensing signal in a period in which the human body is not in proximity to or not in contact with the electrostatic capacitance sensor, and the magnitude of the sensing signal is a value relative to the reference value.

8. The operation switch according to claim 7, wherein the controller further updates the reference value, when the sensing signal is larger than the first threshold at the first time point, and the controller determines that the object is not a human body.

9. The operation switch according to claim 1, wherein the controller further generates an operation signal for operating a predetermined device after the object is the human body.

10. The operation switch according to claim 9, wherein the controller further generates an operation signal for controlling light of a light device after the object is the human body.

11. An operation switch comprising:
an electrostatic capacitance sensor that generates a sensing signal in response to approach or contact of an object; and
a controller that
calculates, when the sensing signal exceeds a first threshold at a first time point, a rate of change in a magnitude of the sensing signal in a first period including the first time point,
determines, when the rate of change is not larger than a first rate, the object is a human body,
determines, when the rate of change is larger than the first rate and further when the sensing signal remains below a second threshold over a predetermined period after the sensing signal falls below the second threshold once, the object is a human body, and
determines, when the rate of change is larger than the first rate and further when the sensing signal exceeds the second threshold in the predetermined period after the sensing signal falls below the second threshold once, the object is not a human body.

12. The operation switch according to claim 11, wherein the first threshold and the second threshold are the same.

13. The operation switch according to claim 11, wherein the first threshold is larger than the second threshold.

14. The operation switch according to claim 11, wherein the first threshold is smaller than the second threshold.

15. An operation switch comprising:
an electrostatic capacitance sensor that generates a sensing signal in response to approach or contact of an object; and
a controller that
calculates, when the sensing signal exceeds a first threshold at a first time point, a rate of change in a magnitude of the sensing signal in a first period including the first time point,
determines, when the rate of change is within a range from a second rate to a first rate, the object is a human body,
determines, when the rate of change is larger than the first rate and further when the sensing signal does not fall below a second threshold in a second period subsequent to the first period, the object is not a human body, and
determines, when the rate of change is smaller than the second rate and further when the sensing signal does not fall below the second threshold in the second period, the object is not a human body.

16. The operation switch according to claim 15, wherein the first threshold and the second threshold are the same.

17. The operation switch according to claim 15, wherein the first threshold is larger than the second threshold.

18. The operation switch according to claim 15, wherein the first threshold is smaller than the second threshold.

* * * * *